United States Patent [19]

Smothers

[11] Patent Number: 5,484,927
[45] Date of Patent: Jan. 16, 1996

[54] VISIBLE DYE PHOTOSENSITIZERS DERIVED FROM TROPINONE

[75] Inventor: William K. Smothers, Hockessin, Del.

[73] Assignee: E. I. Du Pont de Nemours and Company, Wilmington, Del.

[21] Appl. No.: 292,199

[22] Filed: Aug. 19, 1994

Related U.S. Application Data

[60] Continuation-in-part of Ser. No. 46,913, Apr. 15, 1993, abandoned, which is a division of Ser. No. 867,492, Apr. 13, 1992, Pat. No. 5,236,808.

[51] Int. Cl.⁶ .............................................. C07D 451/02
[52] U.S. Cl. ............................................................ 546/126
[58] Field of Search ............................................... 546/126

[56] References Cited

U.S. PATENT DOCUMENTS

| | | | |
|---|---|---|---|
| 4,415,621 | 11/1983 | Specht et al. | 428/172 |
| 4,755,450 | 4/1988 | Sanders et al. | 430/285 |
| 4,859,572 | 8/1989 | Faird et al. | 430/915 |
| 4,917,977 | 4/1990 | Smothers | 430/1 |
| 4,987,057 | 1/1991 | Kaji et al. | 430/281 |
| 4,987,230 | 1/1991 | Monroe | 546/94 |
| 5,055,372 | 10/1991 | Shanklin et al. | 430/281 |

FOREIGN PATENT DOCUMENTS

| | | |
|---|---|---|
| 0300410 | 7/1988 | European Pat. Off. . |
| 0352774 | 7/1989 | European Pat. Off. . |

OTHER PUBLICATIONS

B. Gutkowsha et al., Synthesis of some 2,4-substituted nortropan-3-one derivatives, *Acta Pol. Pharm.*, 42(5), 437-41 (1985).

B. Gutkowsha et al., Synthesis of 2,4-bis(arylmethine)-8-butyl-azabicylo[3.2.1] octan-3-one derivatives, *Acta Pol. Pharm.*, 46(3), 212-8 (1989).

Hacks Chemical Dictionary, "aryl", McGraw-Hill Book Co., N.Y., p. 62. 1972.

The Condensed Chemical Dictionary, Hawley, Van Nostra Reinhold Co., Ny, p. 30, "alicyclic"., 1981.

*Primary Examiner*—Marianne M. Cintins
*Assistant Examiner*—Phyllis G. Spivack

[57] ABSTRACT

Visible light absorbing dyes derived from tropinone are disclosed.

6 Claims, No Drawings

VISIBLE DYE PHOTOSENSITIZERS DERIVED FROM TROPINONE

RELATED APPLICATIONS

The present patent application is a continuation-in-part of Ser. No. 08/046,913 filed Apr. 15, 1993, now abandoned which is a divisional application of Ser. No. 07/867,492 filed Apr. 13, 1992, now U.S. Pat. No. 5,236,808.

FIELD OF THE INVENTION

This invention relates to photopolymerizable compositions containing photoinitiator systems that absorb in the visible. More particularly, this invention pertains to photopolymerizable compositions containing selected photodissociable initiators in combination with visible sensitizers.

BACKGROUND OF THE INVENTION

Many of the conventional photoinitiators or photoinitiator systems limit the applicability of photopolymerizable compositions because they are activatable primarily by radiation in the ultraviolet or shorter wavelength region (i.e., blue and green) of the visible spectrum. The availability of reliable, relatively inexpensive lasers which emit in the longer wavelength (i.e., red) region of the visible spectrum and which can be used as output devices for electronic imaging systems has made it desirable to develop photoinitiator systems which are activatable by this spectral region. Applications for photopolymerizable compositions containing these photoinitiator systems include graphic arts films, proofing, printing plates, and photoresists. The preparation of holograms in photopolymerizable compositions also requires photoinitiator systems activatable by radiation in this spectral region.

Photopolymerizable compositions containing 2,2',4,4',5,5'-hexaarylbisimidazoies, or HABI's, are well known. Sensitizers which extend the sensitivity of these compositions are also known. Baum, U.S. Pat. No. 3,652,275, discloses photopolymerizable compositions containing selected bis(p-dialkylaminobenzylidene)-ketones as sensitizers of HABI photoinitiator systems. Dueber, U.S. Pat. No. 4,162,162, discloses selected sensitizers derived from aryl ketones and p-dialkylaminoaldehydes. Smothers, U.S. Pat. No. 4,917,977, and Monroe, U.S. Pat. No. 4,987,230, also disclose visible sensitizers for photopolymerizable compositions. However, despite the advances which have been made, there is a continuing need for photoinitiator systems which are sensitive to the visible region of the spectrum.

SUMMARY OF THE INVENTION

The novel compositions of this invention are photopolymerizable compositions in which polymerization is initiated by free radicals generated by actinic radiation. As described herein, these compositions comprise a photoinitiator system comprising a sensitizer; a polymerizable monomer; and, optionally, a binder. The composition may also comprise other ingredients which are conventional components of photopolymerizable systems.

The sensitizers used in this invention typically produce produce photopolymerizable compositions with photospeeds which are superior to those of compositions containing comparable prior art compounds, such as those disclosed in Smothers, U.S. Pat. No. 4,917,977, and Monroe, U.S. Pat. No. 4,987,230. The sensitizers of this invention have superior aging properties, that is, the absorption due to these sensitizers does not fade on storage. This is particularly important in commercial applications in which the photopolymerizable composition must be shipped and stored following manufacture. In addition, following exposure of these compositions, residual absorption in the visible is reduced by thermal treatment. This is especially important in the production of holograms, such as holographic optical elements, which should have as little residual absorption in the visible as possible. Manufacture of these materials typically includes a thermal processing step.

In one embodiment this invention is a sensitizer for a photopolymerizable composition comprising at least one ethylenically unsaturated monomer capable of free radical initiated addition polymerization and an initiator system activatable by actinic radiation comprising a sensitizer, wherein said photoinitiator system is present in an amount sufficient to initiate polymerization of said monomer on exposure of said composition to actinic radiation, the improvement wherein comprising said sensitizer is a compound of structure:

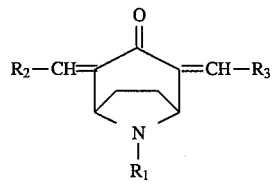

I wherein:
R$_1$ is (1) hydrogen, (2) substituted or unsubstituted alkyl of 1 to 8 carbon atoms, (3) CH$_2$=CHCO-, (4) CH$_2$=C(CH$_3$)CO-(5) R$_{15}$CO-, where R$_{15}$ is a substituted or unsubstituted aryl of 5 to 10 atoms or a substituted or unsubstituted alkyl containing 1 to 8 carbon atoms; and R$_2$ and R$_3$, alike or different, are:

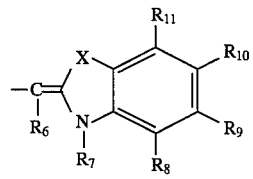

II wherein:
X is O, S, Se, NR$_{12}$, or CR$_{13}$R$_{14}$, where R$_{12}$, R$_{13}$, and R$_{14}$ are each independently alkyl of 1 to 6 carbon atoms or substituted or unsubstituted phenyl;

R$_6$ is hydrogen or substituted or unsubstituted alkyl of 1 to 4 carbon atoms;

R$_7$ is (1) substituted or unsubstituted alkyl or cycloalkyl of 1 to 8 carbon atoms or (2) substituted or unsubstituted aryl of 5 to 10 atoms;

R$_8$, R$_9$, R$_{10}$, and R$_{11}$ each independently hydrogen, halogen, dialkylamino, substituted or unsubstituted alkyl or cycloalkyl of 1 to 6 carbon atoms, substituted or unsubstituted alkoxyl of 1 to 6 carbon atoms, substituted or unsubstituted thioalkoxyl of 1 to 6 carbon atoms, or substituted phenyl; or (R$_8$ and R$_9$), (R$_9$ and R$_{10}$), or (R$_{10}$ and R$_{11}$) are joined in a substituted or unsubstituted aromatic ring of 5 to 10 atoms.

In a preferred embodiment the photopolymerizable composition also comprises a binder. In another preferred embodiment, R$_2$ and R$_3$ are the same. In a more preferred embodiment the initiator system additionally comprises either (1) a hexaarylbisimidazole and a coinitiator or (2) an (alpha-halo)methyl-1,3,5-triazine and a borate salt.

DETAILED DESCRIPTION OF THE INVENTION

Photopolymerizable Compositions Sensitizers

The sensitizers of this invention are represented by structure I, above. Where substitution is possible, any of the aliphatic or aromatic groups present in the sensitizers may be substituted by any of the well-know organic substituents provided the presence of the substituents does not adversely affect the properties of the sensitizer or of the photopolymerizable system needed for the operation of the invention. These properties include, for example, the solubility, absorption spectrum, and stability of the sensitizer. In addition, the presence of the substituent should not cause the sensitizer to adversely affect the stability of the photopolymerizable composition in which it is present or interfere with polymerization of the monomer.

Such substituents include, for example: halogen, such as, for example, chlorine, bromine, and fluorine; cyano; nitro; alkoxy, such as, for example, methoxy, ethoxy, i-propoxy, 2-ethoxyethoxy, and benzyloxy; aryloxy, such as, for example, phenoxy, 3-pyridyloxy, 1-naphthyloxy, and 3-thenyloxy; thioalkoxy, such as, for example, thioethoxy, thiophenoxy, p-chlorothiophenoxy; acyloxy such as, for example, acetoxy, benzyloxy, and phenylacetoxy; aryloxycarbonyl, such as, for example, phenoxycarbonyl; alkoxycarbonyl, such as, for example, methoxycarbonyl; sulfonyl such as, for example, methanesulfonyl and 12-toluenesulfonyl; carbamoyl, such as, for example, N-phenylcarbamoyl; acyl, such as, for example, benzoyl and acetyl; acylamido, such as, for example, 12-toluenesulfonamido, benzamido, and acetamido; alkylamino, such as, for example, diethylamino, ethylbenzylamino, and i-butylamino; arylamino, such as, for example, anilino and diphenylamino. The aryl groups may also be substituted with substituted or unsubstituted alkyl groups, such as, for example, methyl, ethyl, cyclopentyl, 2-ethoxyethyl, benzyl, etc.

$R_1$ may be hydrogen, or alkyl or cycloalkyl of one to eight carbon atoms, such as, for example, methyl, ethyl, n-propyl, iso-butyl, n-hexyl, cyclopentyl, cyclohexyl, benzyl, etc. $R_1$ may be acrylate or methacrylate. $R_1$ may also be aryl or heteroaryl of five to ten atoms, such as, for example, phenyl, naphthyl, pyridinyl, furanyl, thiophenyl, etc. $R_1$ may also be $R_{15}CO-$, where $R_{15}$ is an aromatic group of five to ten atoms or an alkyl group of 1 to 8 carbon atoms. These groups may be unsubstituted or may be substituted as described above. $R_1$ is preferably hydrogen, alkyl of one to seven carbon atoms, or $R_{15}CO-$, where $R_4$ is methyl or substituted or unsubstituted phenyl. $R_1$ is most preferably selected from the group consisting of hydrogen, methyl, ethyl, i-propyl, n-propyl, benzyl, acetyl, and benzoyl.

Although not required for the practice of this invention, for ease of synthesis it is preferred that $R_2$ and $R_3$ be the same.

In another group of preferred sensitizers, $R_2$ and $R_3$ are the same and are represented by structure II, above. $R_7$ may be alkyl or cycloalkyl of one to eight carbon atoms, such as, for example, methyl, ethyl, n-propyl, iso-butyl, n-hexyl, cyclopentyl, cyclohexyl, benzyl, etc. $R_7$ may also be aryl or heteroaryl of five to ten atoms, such as, for example, phenyl, naphthyl, pyridinyl, furanyl, thiophenyl, etc. These groups may be unsubstituted or may be substituted as described above. $R_7$ is preferably an alkyl group of 1 to 4 carbon atoms, more preferably methyl or ethyl.

In one more preferred group of sensitizers, X is $C(CH_3)_2$. In a still more preferred group $R_6$, $R_8$, $R_9$, $R_{10}$, and $R_{11}$ are the same and equal to hydrogen and $R_7$ is alkyl of 1 to 4 carbon atoms. A representative member of this group is sensitizer S-1.

In another more preferred group, X is O. In a still more preferred group $R_6$, $R_8$, $R_9$, $R_{10}$, and $R_{11}$ are the same and equal to hydrogen and $R_7$ is alkyl of 1 to 4 carbon atoms. A representative member of this group is sensitizer S-2.

In another more preferred group, X is S. In a still more preferred group $R_6$, $R_8$, $R_9$, $R_{10}$, and $R_{11}$ are the same and equal to hydrogen and $R_7$ is alkyl of 1 to 4 carbon atoms. A representative member of this group is sensitizer S-3. In another still more preferred group $R_6$, $R_{10}$, and $R_{11}$ are the same and equal to hydrogen, $R_7$ is alkyl of 1 to 4 carbon atoms, and $R_8$ and $R_9$ are joined to form a six membered aromatic ring. A representative member of this group is sensitizer S-4.

The sensitizers of this invention may be used individually or in combination with other members of the same class of sensitizers or with other sensitizing compositions, such as the sensitizers disclosed in Baum, U.S. Pat. No. 3,652,275; Dueber, U.S. Pat Nos. 4,162,162 and 4,454,218; Smothers, U.S. Pat. No 4,917,977; and Monroe, U.S. Pat. No. 4,987,230. The use of two or more such compositions effects sensitization over a broader spectral range to match a variety of laser output radiation.

Hexaarylbisimidazoles

The sensitizers may be used in conjunction with a 2,2',4,4',5,5'-hexaarylbisimidazole, or HABI. These compounds, which dissociate on exposure to actinic radiation to form the corresponding triarylimidazolyl free radicals, have been described in: Chambers, U.S. Pat. No. 3,479,185; Cescon, U.S. Pat. No. 3,784,557; Dessauer, U.S. Pat. Nos. 4,252,887 and 4,311,783; Tanaka, U.S. Pat. No. 4,459,349; Wada, U.S. Pat. No. 4,410,621; Sheets, U.S. Pat. 4,662,286; and Sato, U.S. Pat. No. 4,760,150. The hexaarylbisimidazoles absorb maimally in the 255–275 nm region of the spectrum, and usually show some, though lesser, absorption in the 300–375 nm region. Although the absorption bands tend to tail out to include wavelengths as high as 430 nm, in the absence of a sensitizer these compounds normally require light rich in the 255–375 nm region of the spectrum for their dissociation.

Preferred HAB's are 2-o-chlorosubstituted hexaphenylbisimidazoles in which the other positions on the phenyl radicals are unsubstituted or substituted with chloro, methyl or methoxy. These compounds are disclosed in Dessauer, U.S. Pat. No. 4,252,887 and Sheets, U.S. Pat. No. 4,662,286. Particularly preferred are: o-Cl HABI, 2,3-di-Cl HABI, 2,4-di-Cl HABI, and 2,3,5-TCl HABI.

Generally, one or more coinitiators consisting of a hydrogen atom donor, chain transfer agent, leuco dye, or electron donor are used with the hexaarylbisimidazole and sensitizer. Useful coinitiators are disclosed in Chambers, U.S. Pat. Nos. 3,479,185 and Smothers, 4,994,347. Suitable coinitiators include: organic thiols, such as 2-mercaptobenzothiazole, 2-mercaptobenzoxazole, and 2-mercaptobenzimidazole. Others which can be used include various tertiary amines known in the art, N-phenylglycine, and 1,1-dimethyl-3,5-diketocyclohexane. Except for systems which contain N-vinyl carbazole monomer, the preferred coinitiators are N-phenyl glycine, 2-mercaptobenzoxazole and 2-mercaptobenzothiazole. For photopolymerizable compositions which contain the monomer N-vinyl carbazole, the preferred chain transfer agents are: 5-chloro-2-mercaptobenzothiazole; 2-mercaptobenzothiazole; 1-H-1,2,4-triazole-3-thiol; 6-ethoxy-2-mercaptobenzothiazole; 4-methyl-4H-1,2,4-triazole-3-thiol; and 1-dodecanethiol.

Borate Anion/1,3,5-Triazine

The sensitizers may be used in conjunction with a borate anion and an (alpha:halo)methyl-1,3,5-triazine. Useful borate anions are disclosed in Gottschalk, U.S. Pat. Nos 4,772,530 and 4,772,54 1, and Koike, U.S. Pat. No. 4,950, 581. The borate anions are represented by the following general formula:

$BZ_1Z_2Z_3Z_4^-$ where $Z_1$, $Z_2$, $Z_3$, and $Z_4$, are independently selected from the group consisting of alkyl, aryl, aralkyl, alkenyl, alkynyl, alicyclic, heterocyclic, and allyl groups, with the proviso that at least one of $Z_1$, $Z_2$, $Z_3$, and $Z_4$, is not aryl.

Each group may contain up to twenty carbon atoms, but groups with about seven carbon atoms or less are preferred. The alkyl groups may be linear, branched or cyclic, and may be substituted or unsubstituted. Representative alkyl groups which may be present are, ibr example: methyl, ethyl, n-propyl, i-butyl, sec-butyl, n-butyl, n-pentyl, etc. Representative cyclic alkyl groups include cyclobutyl, cyclopentyl, and cyclohexyl.

Representative examples of aralkyl groups are benzyl and benzyl substituted with such groups as, for example, alkyl, alkoxyl, halo, cyano, and other conventional aromatic substituents. Representative examples of aryl groups include phenyl and naphthyl, which may be unsubstituted or substituted with groups such as, for example, alkyl, alkoxyl, halo, cyano, nitro, and other conventional aromatic substituents. Representative alkenyl groups are propenyl and ethynyl. Examples of heterocyclic groups include, for example, 3-thiophenyl, 4-pyridinyl, and 3-thiophenyl substituted with conventional aromatic substituents.

Preferably, at least one, but not more than three, of $Z_1$, $Z_2$, $Z_3$, and $Z_4$ is an alkyl group. More preferred are anions in which $Z_1$–$Z_4$ is a combination of three aryl groups and one alkyl group. The phenyl and p-methoxyphenyl groups are preferred aryl groups. A preferred group of anions are the triphenylalkylborate anions. A preferred anion is triphenylbutylborate.

It is preferred that the cation associated with the borate anion not absorb a significant amount of actinic radiation since this would decrease photospeed. Representative cations are alkali metal cations and quaternary ammonium cations.

Quaternary ammonium cations containing four alkyl groups are preferred. The alkyl groups may be linear, branched or cyclic, and may be substituted or unsubstituted. Representative quaternary ammonium cations are tetramethylammonium, tetraethylammonium, tetrabutylammonium, benzyltrimethylammonium, benzyldimethyltetradecylammonium, and (2-hydroxyethyl)trimethyl ammonium.

Cations with larger alkyl groups may be used to advantage since the solubility of the borate salt in the coating solvent is generally increased. Cations in which the alkyl groups together contain up to a total about thirty carbon atoms are preferred. Hydroxyl substitution may improve solubility and/or photospeed. Particularly preferred cations are (2-hydroxyethyl)trimethyl ammonium and benzyldimethyltetradecyl ammonium.

The borate ion and sensitizer are used in conjunction with an s-triazine comprising at least one (alpha-halo)methyl group. Examples of triazines are given in Bonham, U.S. Pat. No. 3,987,037; Buhr, U.S. Pat. No. 4,619,998; Kawammura, U.S. Pat. No. 4,772,534; Koike, U.S. Pat. Nos. 4,810,618 and 4,950,581; Higashi, U.S. Pat. No. 4,826,753; and Coyle, U.S. Pat. No. 4,912,218. s-Triazines are represented by the following structure:

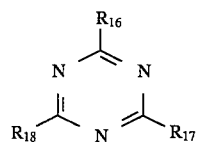

wherein $R_{16}$, $R_{17}$, and $R_{18}$, which may be the same or different, each represent a hydrogen, an alkyl group, a substituted alkyl group, an aryl group, a substituted aryl group, an aralkyl group, an amino group, a substituted amino group, or an alkoxyl group, with the proviso that at least one of these substituents is a mono-, di-, or tri-halogen-substituted methyl group. Examples of the mono-, di-, and tri-halogen-substituted methyl group include: chloromethyl, bromomethyl, iodomethyl, dichloromethyl, dibromomethyl, diiodomethyl, trichloromethyl, tribromomethyl, and triiodomethyl.

More preferred are triazines which contain at least one dichloromethyl or trichloromethyl group. The most preferred triazines contain at least one trichloromethyl group. The most preferred triazine is 2,4,6-tris(trichloromethyl)-1,3,5-triazine.

Monomers/Binders

The composition contains at least one ethylenically unsaturated compound, generally known as a monomer, which undergoes free-radical initiated polymerization to form a high molecular weight compound. The composition contains at least one such material and may contain a mixture of such materials. In general, preferred monomers for photopolymer applications have boiling points greater than 100° C., more preferably, greater than 150° C.

Typical monomers are: unsaturated esters of alcohols, preferably polyols, such as, diethylene glycol diacrylate, glycerol triacrylate, ethylene glycol dimethacrylate, pentaerythritol tri- and tetraacrylate and methacrylate; unsaturated amides, such 1,6-hexamethylene bis-acrylamide; vinyl esters such as divinyl succinate, divinyl phthalate, and divinyl benzene-1,3-disulfonate; styrene and derivatives thereof; and N-vinyl compounds, such as N-vinyl carbazole. Numerous other unsaturated monomers polymerizable by free-radical initiated polymerization and useful in photopolymerizable compositions are known to those skilled in the art. For photoresist applications the preferred monomers are trimethylolpropane triacrylate, the triacrylate ester of ethoxylated trimethylolpropane, tetraethylene glycol diacrylate, and tetraethylene glycol dimethacrylate.

The binder is an optional component present in the preferred photopolymerizable compositions. The binder is a preformed macromolecular polymeric or resin material. In general, the binder should be soluble in the coating solvent and compatible with the other components of the photopolymerizable system. Representative binders are poly(methyl methacrylate) and copolymers of methyl methacrylate with other alkyl acrylates, alkyl methacrylates, methacrylic acid, and/or acrylic acid; poly(vinyl acetate) and its partially hydrolyzed derivatives; gelatin; cellulose esters and ethers, such as cellulose acetate butyrate; and polyethylene oxides. Numerous other binders useful in photopolymerizable compositions are known to those skilled in the art.

Photopolymerizable compositions adapted for recording holograms are disclosed in: Haugh, U.S. Pat. No. 3,658,526; Chandross, U.S. Pat. No. 3,993,485; and Fielding, U.S. Pat. Nos. 4,535,041 and 4,588,664. Preferred photopolymerizable compositions are disclosed in Keys, U.S. Pat. No. 4,942,102; Monroe, U.S. Pat. No. 4,942,112; Smothers, U.S. Pat. No. 4,959,284; and Trout, U.S. Pat. No. 4,963,471. In the preferred compositions either the monomer or the binder comprises one or more moieties selected from the group consisting of (1) aromatic moieties selected from the group consisting of (i) substituted or unsubstituted phenyl, (ii) substituted or unsubstituted naphthyl, and (iii) substituted or unsubstituted heterocyclic aromatic moieties having up to three rings; (2) chlorine; (3) bromine, and mixtures thereof; and the other constituent is substantially free of said moiety or moieties. Compositions in which the monomer contains said moiety are more preferred.

For systems in which the monomer contains said moiety and the binder is free of said moiety, liquid monomers include, for example: 2-phenoxyethyl acrylate, 2-phenoxyethyl methacrylate, phenol ethoxylate monoacrylate, 2-(p-chlorophenoxy)ethyl acrylate, phenyl acrylate, 2-(1-naphthyloxy)ethyl acrylate, ethyl 1-benzoyl-2-vinyl-1-cyclopropane carboxylate, etc. Solid monomers, which may be used to advantage in combination with liquid monomers include, for example: N-vinyl carbazole; 2,4,6-tribromophenyl acrylate or methacrylate; pentachlorophenyl acrylate or methacrylate; 2-naphthyl acrylate or methacrylate; etc. Binders include, for example: cellulose acetate butyrate; poly(methyl methacrylate); poly(vinyl butyral); poly(vinyl acetate); and fluorine containing binders containing 3 to 25% by weight fluorine, such as copolymers of vinyl acetate with tetrafluoroethylene and/or hexafluoropropylene. For reflection holograms, the preferred binders are poly(vinyl butyral), poly(vinyl acetate), and copolymers of vinyl acetate with tetrafluoroethylene and/or hexafluoropropylene containing 3 to 25% by weight fluorine, such the 82:18 (mole %) vinyl acetate/tetrafluoroethylene copolymer.

For systems in which the binder contains said moiety and the monomer is free of said moiety, monomers include, for example: triethylene glycol diacrylate and dimethacrylate, decanediol diacrylate, ethoxyethoxyethyl acrylate, isobornyl acrylate, ethyl 1-acetyl-2-vinyl-1-cyclopropane carboxylate, etc. Binders include, for example: polystyrene and copolymers containing at least about 60% styrene.

If crosslinking of the photopolymer is desired, up to about five weight percent of at least one multifunctional monomer containing two or more terminal ethylenically unsaturated groups may be incorporated into the composition. The polyfunctional monomer must be compatible with the other components of the composition and is preferably a liquid. Suitable monomers include the di-(2-acryloxyethyl)ether of bisphenol A, ethoxylated bisphenol A diacrylate, etc.

Other Components

Other components conventionally added to photopolymerizable compositions can be present to modify the physical properties of the film. Such components include: plasticizers, thermal stabilizers, optical brighteners, ultraviolet radiation absorbing material, adhesion modifiers, coating aids, and release agents.

A plasticizer may be present to modify adhesion, flexibility, hardness, and other mechanical properties of the film in a conventional fashion. When a binder is present, a plasticizer would be selected which is compatible with the binder as well as the ethylenically unsaturated monomer and other components of the composition. With acrylic binders, for example, plasticizers can include dibutyl phthalate and other esters of aromatic acids; esters of aliphatic polyacids, such as diisooctyl adipate; aromatic or aliphatic acid esters of glycols, polyoxyalkylene glycols, aliphatic polyols; alkyl and aryl phosphates; and chlorinated paraffins. In general, water insoluble plasticizers are preferred for greater high humidity storage stability, but are not necessary to get improved latitude.

Many ethylenically unsaturated monomers are subject to thermal polymerization, especially when stored for long periods or at elevated temperatures. Normally a conventional polymerization inhibitor will be present to improve the storage stability the photopolymerizable composition. The dinitroso dimers described in Pazos, U.S. Pat. No. 4,168,982, may also be useful. Since monomers generally contain thermal polymerization inhibitors added by their manufacturers, it is frequently unnecessary to add additional inhibitor.

Nonionic surfactants may be added to the photopolymerizable composition as coating aids. Typical coating aids are polyethylene oxides, such as Polyox®WSRN, and fluorinated nonionic surfactants, such as Fluorad® FC-430 and Fluorad® FC-431.

Optical brighteners, such as those disclosed in U.S. Pat. Nos. 2,784,183; 3,664,394; and 3,854,950 may be added to reduce distortion due to halation. Ultraviolet radiation absorbing materials are also disclosed in U.S. Pat. No. 3,854,950.

Depending on the application, inert additives, such as dyes, pigments and fillers, can be employed. These additives are generally present in minor amounts so as not to interfere with exposure of the photopolymerizable layer.

Composition

The photoinitiator system must be present in sufficient amount to initiate polymerization of the monomer on exposure to actinic radiation. Sufficient monomer must be present so that the physical property change necessary for readout is produced on exposure and polymerization. Typical physical property changes used for readout include: solubility, permeability, adhesion and cohesion, tackiness or tonability, electrical conductivity, and refractive index. (see, for example, B. M. Monroe in *Radiation Curing: Science and Technology*, S. P. Pappas, Ed., Plenum, New York, 1992, pp. 399–440.) The binder, if present, must be present in sufficient amount to form a film when the composition is coated.

While the composition of the photopolymerizable composition will depend on the intended application, in general, the proportions of ingredients will generally be within the following percentage ranges, based on the total weight of the composition: photoinitiator system (sensitizer plus other components of the photoinitiator system) about 0.3% to about 15%; monomer about 80% to about 99%; binder about 0% to about 90%; and other ingredients about 0% to about 5%. If the composition is to be used as a dry film, the binder should be at least about 25% and the monomer should not exceed about 60% of the composition. If the amount of binder is below approximately 25%, or the amount of monomer exceeds approximately 60%, the composition has insufficient viscosity to form a dry film.

The amount of sensitizer present will depend on the wavelength(s) of actinic radiation used for exposure, the absorption spectrum of the sensitizer, and the thickness of the layer of photopolymerizable composition. As described by Thommes and Webers, *J. Imam. Sci.*, 29, 112 (1985), an optical density of 0.43 produces efficient photopolymerization for systems which are developed by washout, such as photoresists. It is generally preferred that the absorption maximum of the sensitizer be matched to the intensity maximum of the source of actinic radiation. In general the sensitizer will comprise about 0.05 to about 1.0% preferably about 0.1% to about 0.50% of the composition.

For photopolymerizable compositions adapted for the preparation of holograms proportions of ingredients will generally be within the following percentage ranges, based on the total weight of the composition: binder 25 to 90%, preferably 45 to 75%; monomer(s), 5 to 60%, preferably, 15 to 50%; plasticizer, 0 to 25%, preferably, 0 to 15%; photoinitiator system, 0.1 to 10%, preferably 1 to 7%; and other ingredients, 0 to 5%, typically 0 to 4%.

Substrates/Coating

The photopolymerizable compositions can be coated onto a wide variety of substrates. By "substrate" is meant any natural or synthetic support, preferably one which is capable of existing in a flexible or rigid form. For example, the substrate can be a metal sheet or foil, a sheet or film of synthetic organic resin, cellulose paper, fiberboard, and the like, or a composite of two or more of these materials.

The particular substrate will generally be determined by the intended application, For example, when printed circuits are produced, the substrate may be a plate which is a copper coating on fiberboard; in the preparation of of lithographic printing plates, the substrate may be anodized aluminum. Specific substrates include alumina-blasted aluminum, anodized aluminum, alumina-blasted polyethylene terephthalate film, polyethylene terephthalate film, e.g., resin-subbed polyethylene terephthalate film, polyvinyl alcohol-coated paper, cross-linked polyester-coated paper, nylon, glass, cellulose acetate film, heavy paper such as lithographic paper, and the like. For the preparation of holograms, polyethylene terephthalate film is preferred.

Exposure

Any convenient source or sources of actinic radiation providing wavelengths in the region of the spectrum that overlap the absorption bands of the photosensitizer can be used to activate photopolymerization. The radiation can be natural or artificial, monochromatic or polychromatic, incoherent or coherent, and for high efficiency should correspond closely to in wavelength to the absorption of the photoinitiator system.

Conventional light sources include fluorescent lamps, mercury, metal additive and arc lamps. Coherent light sources are xenon, argon ion, and ionized neon lasers, as well as tunable dye lasers and the frequency doubled neodymium:YAG laser, whose emissions fall within or overlap the visible absorption bands of the sensitizer.

For the exposure of holographic photopolymer systems coherent light sources, i.e., lasers, are required. Typically ion lasers, which have the required stability and coherence length but operate at a few lines of fixed wavelength, are used. With the development of photopolymer films that are sensitized across the visible spectrum, tunable lasers, such as tunable dye lasers, are required to match the broad spectral sensitivity of these materials. Since is often desirable to record the hologram or holographic optical element (i.e., a hologram which acts as a diffraction grating, a mirror, a lens, or a combination of optical elements) with the same wavelength actinic radiation which will be used for reconstruction, tunable lasers offer added flexibility of recording a hologram and making a holographic optical element at any desired wavelength or at more than one selected wavelength.

In the preparation of holograms from the compositions of this invention, the hologram is fixed by a second, overall exposure to actinic radiation. The refractive index modulation of the hologram can be enhanced by heating to 100°–150° C. for about 0.5– 3 hr following overall exposure.

Holographic Recording Systems

Holography is a form of optical information storage. The general principles are described in a number of references, e.g., "Photography by Laser" by E. N. Leith and J. Upatnieks in *Scientific American,* 212 (6) 24–35 (June, 1965). A useful discussion of holography is presented in "Holography", by C. C. Guest, in *Encyclopeclia of Physical Science and Technology,* Vol. 6, pp. 507–519, R. A. Meyers, Ed., Academic Press, Orlando, Fla., 1987.

The object to be imaged is illuminated with coherent light and a light sensitive recording medium is positioned so as to receive light reflected from the object. This beam of reflected light is known as the object beam. At the same time, a portion of the coherent light is directed to the recording medium, bypassing the object. This beam is known as the reference beam. The interference pattern that results from the interaction of the reference beam and the object beam impinging on the recording medium is recorded in the recording medium.

Holograms that are formed by allowing the reference and object beams to enter the recording medium from the same side are known as transmission holograms. Transmission holograms may be produced by methods which are well known in the art, such as disclosed in Leith and Upatnieks, U.S. Pat. Nos. 3,506,327; 3,838,903 and 3,894,787.

Holograms formed by allowing the reference and object beams to enter the recording medium from opposite sides, so that they are traveling in approximately opposite directions, are known as reflection holograms. Reflection holograms may be produced by the on-axis method. The reference beam is projected through the recording medium onto an object. The object reflects light which returns and interacts with the reference beam in the plane of the recording medium.

Reflection holograms also may be produced by an off-axis method. The original beam of coherent radiation is split into two portions. One portion is projected onto the medium. The other is manipulated to project onto an object behind the medium. Reflection holograms produced by an off-axis process are disclosed in Hartman, U.S. Pat. No. 3,532,406.

The photopolymerizable compositions of this invention are sensitive to visible light. This allows them to be exposed with a variety of visible light sources. The broad sensitization range enables polymeric images, which may be further processed by development to produce resist images, or other relief images, to be formed. These compositions are useful in printing plates for offset and letter press, as well as photoresists in liquid or dry film form for making printed circuits or in chemical milling or in solder masks. Other specific uses for the compositions of this invention and the images prepared therefrom will be evident to those skilled in the art.

Certain compositions of this invention are particularly useful for the formation of holograms. These holograms can also be used as displays, head-up displays, holographic optical elements, holographic notch filters, security applications, etc. Other specific uses for holograms prepared from these compositions will be evident to those skilled in the art.

Syntheses

The sensitizers are readily prepared by base catalyzed condensation of an aldehyde or dimethinehemicyanine with the corresponding ketone. Procedures are given in Gutkowska, et al., *Acta Pol. Pharm.*, 42(5), 437–441 (1985) and 46(3), 212–218 (1989). The synthesis of sensitizers S-1 to S-5 is described in Examples 1–5. Analogous syntheses can be used to prepare other sensitizers.

The advantageous properties of this invention can be observed by reference to the following examples which illustrate, but do not limit, the invention.

EXAMPLES GLOSSARY

| | |
|---|---|
| o-Cl-HABI | Biimidazole, 2,2'-bis[2-chlorophenyl]-4,4',5,5'-tetraphenyl-; CAS 7189-82-4 |
| 2-Cl-5-NO$_2$-HABI | Biimidazole, 2,2'-bis[2-chloro-5-nitrophenyl]-4,4',5,5'-tetraphenyl- |
| 2,3-di-Cl HABI | Biimidazole, 2,2'-bis[2,3-dichlorophenyl]-4,4',5,5'-tetraphenyl-; CAS 111010-84-5 |
| 2,4-di-Cl HABI | Biimidazole, 2,2'-bis[2,4-dichlorophenyl]-4,4',5,5'-tetraphenyl-; CAS 1707-70-6, CAS 7189-83-5 |
| 2,4-di-F HABI | Biimidazole, 2,2'-bis[2,4-difluorophenyl]-4,4',5,5'-tetraphenyl- |
| DMF | N,N-dimethylformamide |
| o-F-HABI | Biimidazole, 2,2'-bis[2-fluorophenyl]-4,4',5,5'-tetraphenyl; CAS 2326-14-9, CAS 29864-14-0 |
| Fischer's aldehyde | Acetaldehyde, (1,3-dihydro-1,3,3-trimethyl-2H-indol-2-ylidene)- |
| MMT | 4-Methyl-4H-1,2,4-triazole-3-thiol; CAS 24854-43-1 |
| o-NO$_2$ HABI | Biimidazole, 2,2'-bis[2-nitrophenyl]-4,4',5,5'-tetraphenyl-; CAS 85949-83-3, CAS 29864-20-8 |
| NVC | N-Vinyl carbazole; 9-vinyl carbazole; CAS 1484-13-5 |
| Photomer® 4039 | Phenol ethoxylate monoacrylate; CAS 56641-05-5; Henkel Process Chemical Company, Ambler, PA |
| Sartomer 349 | Ethoxylated bisphenol A diacrylate; CAS 24447-78-7; Sartomer Company, West Chester, PA |
| Sensitizer S-1 | 3-Tropanone, 2,4-bis[(1,3-dihydro-1,3,3-trimethyl-2H-indol-2-ylidene)ethylidene]- |
| Sensitizer S-2 | 3-Tropanone, 2,4-bis[2-(3-ethyl-2(3H)-benzoxazolylidene)ethylidene]- |
| Sensitizer S-3 | 3-Tropanone, 2,4-bis[2-(3-ethyl-2(3H)-benzothiazolylidene)-ethylidene]- |
| Sensitizer S-4 | 3-Tropanone, 2,4-bis[2-(1-ethylnaphtho[1,2-d]thiazol-2(1H)-ylidene)ethylidene]- |
| Sensitizer C-1 | Cyclopentanone, 2,5-bis[(1,3-dihydro-1,3,3-trimethyl-2H-indol-2-ylidene)ethylidene]-; CAS 27713-85-5 |
| Sensitizer C-2 | Cyclopentanone, 2,5-bis[2-(3-ethyl-2(3H)-benzoxazolylidene)ethylidene]- |
| Sensitizer C-3 | Cyclopentanone, 2,5-bis[2-(3-ethyl-2(3H)-benzothiazolylidene)-ethylidene]-; CAS 27714-24-5 |
| Sensitizer SQ-1 | 3H-Indolium, 2-[[3-[(1,3-dihydro-3,3-dimethyl-1-ethyl-5-methoxy-2H-indol-2-ylidene)methyl]-2-hydroxy-4-oxo-2-cyclobuten-1-ylidene]methyl]- |

-continued

| | | EXAMPLES GLOSSARY |
|---|---|---|
| | | 5-methoxy-1,3,3-trimethyl-, hydroxide, inner salt |
| | o-TFM HABI | Biimidazole, 2,2'-bis[2-(trifluoromethyl)-phenyl]-4,4',5,5'-tetraphenyl-; CAS 111386-89-1 |
| | 2,3,5-TCl HABI | Biimidazole, 2,2'-bis[2,3,5-trichlorophenyl]-4,4',5,5'-tetraphenyl- |
| | TFE/VAc | Poly(tetrafluoroethylene/-vinylacetate) copolymer: (21:79 or 23:77 by weight wt % as indicated) |
| | THF | Tetrahydrofuran |
| | Vinac® B-100 | Poly(vinyl acetate); M.W. 350,000; CAS 9003-20-7; Air Products, Allentown, PA |

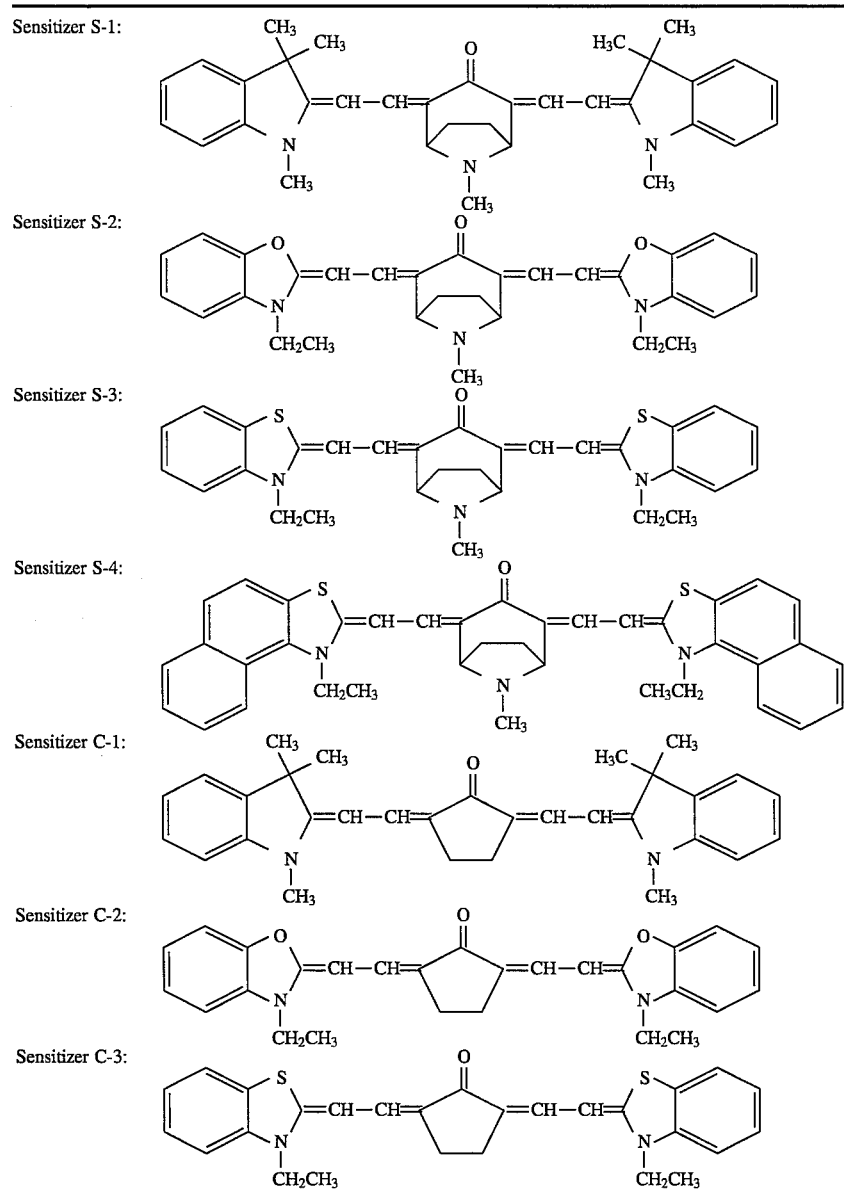

| -continued |
| --- |
| EXAMPLES |
| GLOSSARY |

Sensitizer SQ-1:

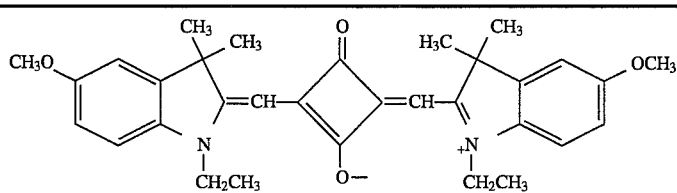

Compound I:

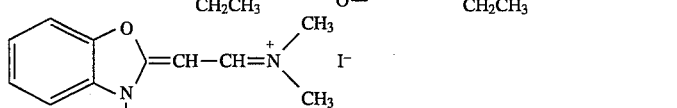

Compound II:

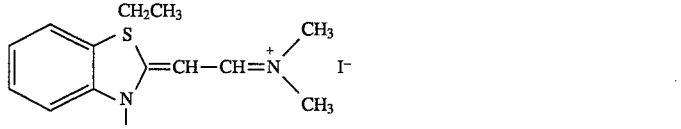

Compound III:

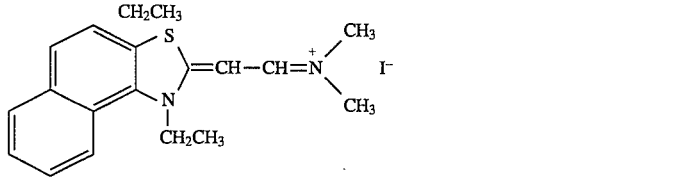

GENERAL PROCEDURES

In the examples which follow, it should by understood that "total solids" refers to the total amount of non-volatile components in the composition even though some of the components may be non-volatile liquids rather than solids at room temperature.

Sample Preparation

All commercially available components were used as received from suppliers without further purification. Coating solutions were prepared in amber bottles under dim light by adding solvent (80– 85% of total solution by weight) and nonvolatile coating ingredients (15%) and mixing with a mechanical stirrer until the ingredients completely dissolved. The solvent was a mixture of dichloromethane (90–95% of total solvent by weight), 2-butanone (0–5%), and methanol (5%).

Solutions were coated onto a 50 micron thick clear film support of polyethylene terephthalate at a speed of 4 cm/sec using a Talboy web-coater equipped with a 150 micron or 200 micron doctor knife, 3.7 m drier set at 50°–70° C., and a laminator station. A coversheet of 25 micron polyethylene terephthalate or 25 micron polypropylene was laminated to the coatings as they exited the drier. Dry coating thickness ranged between 8 and 27 microns. Coated samples were stored in black polyethylene bags at room temperature until used.

Photobleachin

To evaluate photobleaching, the absorbance ($A_o$) of a fresh 2.54 cm×2.54 cm sample of coated film was measured at the wavelength of maximum visible absorption ($1_{max}$) using a standard double beam spectrophotometer (Perkin Elmer model Lambda-9). The sample was scanned from; 380 to 780 nm. The sample was exposed for 1 rain to ultraviolet and visible light from a TheimerStrahler #5027 mercury-arc photopolymer lamp (Exposure Systems Corp., Bridgeport, Conn.) mounted in a Douthitt DCOP-X exposure unit (Douthitt Corp., Detroit, Mich.), and the bleached absorbance value (A) measured at $1_{max}$. Bleaching efficiency (% B) was calculated by:

$$\% B = (A/A_o) \times 100 \qquad \text{(Equation 1)}$$

Residual Absorption

To evaluate residual absorbance, a fresh 2.54 cm×2.54 cm sample of coated film was exposed to ultraviolet and visible light for 1 min as described above and heated for 2 h at 120° C. An absorption spectrum was measured from 380 to 780 nm as described above. The relative residual absorbance (R) was calculated as the ratio of the integrated area of the spectrum (S) to that of a control sample without any dye ($S_o$):

$$R = S/S_o \qquad \text{(Equation 2)}$$

Hologram Recording

Coated film with both the film support and coversheet intact was cut into 10×13 cm sections. The coversheet was removed, and the film was then mounted by laminating the soft, tacky coating onto a clear glass plate. The film support was left in place during exposure and processing operations.

Coating samples mounted on glass plate were evaluated by recording a series holographic mirrors and determining hologram reflection efficiency as a function of exposure and wavelength. Holographic mirrors were formed by first tightly clamping the coating sample-plate between a clear glass cover-plate and a front surface aluminized-glass mirror, with thin xylene layers between. The thin layer of xylene served to optically couple the glass and mirror to the film. Unless otherwise indicated, the sample-plate was exposed by a collimated 514 nm argon-ion laser beam oriented perpendicular to the fihn plane and passing, in order, through the glass cover-plate, xylene layer, film support, coating, glass sample-plate, and xylene layer and then reflecting back onto itself off the mirror. The laser beam had a 2.0 cm diameter and an intensity of 10 mW/cm$^2$. A series of sixteen holographic mirrors were recorded, each at a separate non-overlapping position on the sample-plate, with the laser exposure time incrementally varied using a computer controlled shutter positioned in the laser beam.

After the laser exposure series was complete, the glass cover-plate, aluminum mirror, and xylene layers were removed and the coating was overall exposed to ultraviolet and visible light as described above. The coating was then thermally processed by heating the sample-plate at about 120° C. for 1–3 hr in a forced-air convection oven. The transmission spectrum of each holographic mirror was then recorded using a standard double-beam scanning spectrophotometer (Perkin Elmer model Lambda-9) with the sample beam oriented perpendicular to the plane of the sample-plate. Maximum reflection efficiency and peak reflection wavelength for each holographic mirror was measured from their transmission spectra. Graphs of reflection efficiency at the peak reflection wavelength versus total laser exposure were used to determine photospeed, which is defined here as the minimum laser exposure required to obtain maximum holographic reflection efficiency.

Refractive index modulation (RIM) was calculated from hologram reflection efficiency, reflection wavelength, and coating thickness using the well-known coupled wave theory (H. Kogelnik, *Bell Syst. Tech. J.*, 48, 2909–2947, 1969). From this theory the RIM of a mirror can be calculated from its reflection efficiency, that is, the percent of incident radiation reflected; thickness; and the angle and wavelength of the probe radiation. Since RIM is thickness and wavelength independent, it is a convenient parameter to use in comparing holographic recording efficiency.

Example 1

Sensitizer S-1: Fischer's aldehyde, 20.1 g (0.10 mol), prepared from 2-methylene-1,3,3-trimethylindoline and phosphorous oxychloride in DMF by the procedure of H. Fritz, *Chem. Ber.*, 92, 1809–1817 (1959), was added to a solution of 12.4 g (0.11 mol) of potassium t-butoxide in 100 mL of t-butanol and the resulting mixture was heated to reflux. A solution of 7.0 g (0.05 mol) of 3-tropanone in 35 mL of t-butanol was added over a period of 75 min. The reaction mixture was heated at reflux for an additional 5 hr, diluted with 30 mL of water, and cooled to room temperature. The product separated as an oil. After the aqueous butanol layer was decanted off, the product was dried in vacuo at 55° C. to give 3.8 g of crude, glassy solid. Recrystallization from a mixture of petroleum ether and toluene gave 1.3 g of Sensitizer S-1 (5% yield); mp 182°–185° C.; $1_{max}$=501 nm (CH$_2$Cl$_2$), e=91,000.

Example 2

Compound I: With care being taken to exclude moisture, 800 mL of DMF was chilled to between 0° and 5° C. and 65 g (0.425 mol) of phosphorous oxychloride added over a period of 15 min. To the resulting solution was added 100 g (0.346 mol) of 3-ethyl-2-methylbenzoxazolium iodide. The reaction mixture was stirred at between 5° and 15° C. while 65 g (0.821 mol) of pyridine was added over a period of 45 min. The reaction mixture was warmed to room temperature and quenched by gradually adding 80 mL of water over a period of 15 min while maintaining the reaction temperature at about 35° C. with cooling. The reaction mixture was stirred for about 30 rain and 540 g (3.25 mol) of potassium iodide dissolved in 820 mL water added over 30 min to precipitate product as the iodide salt. The reaction temperature rose to 40° C. during this time. The resulting slurry was chilled in an ice bath and the product collected by filtration. The product was washed successively with ice water, cold methanol, and ether, and dried in vacuo at 55° C. to give 107.3 g of Compound I (90%); mp 275°–276° C.

Sensitizer S-2: A mixture of 1.0 g (7.2 mmol) of 3-tropanone, 5.2 g (15.1 mmol) of Compound I, and 2.8 g (25.0 mmol) of potassium t-butoxide in 25 mL of dry THF was refluxed for 2 hr with care being taken to exclude moisture. The reaction mixture was then poured into 200 mL of water. Precipitated product was collected by filtration, washed with water, and dried in vacuo at 55° C. to give 1.9 g of Sensitizer S-2 (55%); mp 148°–150° C.; $1_{max}$=499 nm (CH$_2$Cl$_2$), e=75,000.

Example 3

Compound II Compound II, mp 282°–283° C., was prepared in 89% yield from 3-ethyl-2-methylbenzothiazolium p-toluenesulphonate and phosphorous oxychloride in DMF as in the preparation of Compound I.

Sensitizer S-3 With care being taken to exclude moisture, 5.0 g (23.0 mmol) of 25% methanolic sodium methoxide solution was added to a solution of 1.0 g (15.8 mmol) of 3-tropanone and 5.7 g (7.2 mmol) of Compound II in 4.3 g of pyridine and 6.5 g of anhydrous methanol. The reaction mixture was heated at reflux for 30 hr and poured into 200 mL of water. The precipitate filtered off; washed successively with water, THF, and diethyl ether; and dried in vacuo at 55° C. to give 1.4 g. of Sensitizer S-3 (39%); mp 159°–162° C.; $1_{max}$=536 nm (CH$_2$Cl$_2$), e=90,000.

Example 4

Compound III: Compound III, mp 211°–212° C., was prepared in 56% yield from 3-ethyl-2-methylnaphtho[1,2-d]thiazolium p-toluenesulphonate and phosphorous oxychloride by the procedure described to prepare Compound I.

Sensitizer S-4: With care being taken to exclude moisture, a mixture of 1.0 g (7.2 mmol) of 3-tropanone, 6.2 g (15.1 mmol) of Compound III and 2.8 g (25.0 mmol) of potassium t-butoxide in 25 mL of dry THF was heated at refluxed for 1 hr. The reaction mixture was chilled in an ice/methanol bath. The precipitate was filtered off; washed successively with water, chilled methanol, and ether; and dried in vacuo at 55° C. to give 3.5 g of Sensitizer S-4 (78%); mp 265°–266° C.; $1_{max}$=560 nm (CH$_2$Cl$_2$), e=95,000.

Examples 5–8 and Control Examples A–D

These examples demonstrate the (1) greater relative photostability, and (2) the typical lower residual absorbance of the sensitizers of this invention relative to comparative compounds. Syntheses of the comparative compounds are given in Smothers, U.S. Pat. No. 4,917,977. Preparation of TFE/VAc binders is given in Trout, U.S. Pat. No. 4,963,471.

Coating solutions were prepared containing: 9.79 g TFE/VAc (21/79 wt %, inherent viscosity 1.5 dL/g in THF); 3.30 g Photomer® 4039; 0.90 g NVC; 0.450 g Sartomer 349; 0.150 g MMT; 0.375 g o-Cl HABI; sensitizer as indicated in Table I; 76.50 g dichloromethane; 4.25 g methanol; and 4.25 g 2-butanone. The solutions were coated with a 150 micron doctor knife, dried, exposed, analyzed for bleaching efficiency, heated 2 hr at 120° C., and analyzed for residual absorbance as described in the General Procedures. Dry coating thickness was between 8 and 12 microns. Results are given in Table 1.

TABLE 1

| Exp. | Sensitizer | Amt. (g) | Photobleaching (% B)[a] | Residual Abs. (R)[b] |
|---|---|---|---|---|
| A | none | 0.0000 | — | 1.0 |
| 5 | S-1 | 0.0270 | 74 | 1.5 |
| B | C-1 | 0.0225 | 44 | 2.2 |
| 6 | S-2 | 0.0270 | 49 | 1.2 |
| C | C-2 | 0.0210 | 34 | 1.4 |
| 7 | S-3 | 0.0270 | 55 | 1.6 |
| D | C-3 | 0.0360 | 38 | 3.0 |
| 8 | S-4 | 0.0360 | 47 | 1.7 |

[a]Absorption remaining at $l_{max}$ after ultraviolet irradiation but before thermal treatment; See Equation 1.
[b]Integrated absorption remaining after thermal treatment; See Equation 2.

Examples 9–15 and Comparative Examples E–G

These examples demonstrate the use the sensitizers of this invention in photopolymerizable compositions and compares the photo speeds of certain of these sensitizers with the photospeeds of similar comparative compounds.

For Examples 10, 11, 13 and 15, and Control Examples E, F, and G, coating solutions were prepared consisting of: 9.79 g TFE/VAc (23/77 wt %, inherent viscosity 1.52 dL/g in THF); 2.85 g Photomer® 4039; 1.35 g NVC; 0.450 g Sartomer 349; 0.150 g MMT; 0.375 g o-Cl HABI; sensitizer as indicated in Table 2; 76.5 g dichloromethane, 4.25 g methanol, and 4.25 g 2-butanone. The solutions were coated with a :150 micron doctor knife, dried, and imaged to record a series of reflection holograms. The holograms were exposed to ultraviolet and visible light and then heated at 120° C. for 1 hr and analyzed for reflection efficiency, refractive index modulation, and photospeed as described in the General Procedures. Dry coating thickness ranged between 10 and 13 microns. Results are given in Table 2.

For Examples 9, 12 and 14, the same procedure was followed except that the coating solutions consisted of 9.79 g TFE/VAc (23/77 wt %, inherent viscosity 1.52 dL/g in THF); 2.70 g Photomer® 4039; 1.35 g NVC; 0.450 g of Sartomer 349; 0.375 g MMT; 0.375 g o-Cl HABI; sensitizer as indicated in Table 2; 76.5 g dichloromethane, 4.25 g methanol, and 4.25 g 2-butanone. Dry coating thickness ranged between 13 and 17 microns.

TABLE 2

| Exp. | Sensitizer | Amt. (g) | Photospeed (mJ/cm$^2$) | RE[a] (%) | Wavelength[b] (nm) | RIM[c] |
|---|---|---|---|---|---|---|
| 9 | S-1 | 0.0180 | 13 | 99.9 | 505 | 0.049 |
| 10 | S-1 | 0.0225 | 15 | 99.9 | 509 | 0.055 |
| E | C-1 | 0.0225 | 19 | 99.6 | 498 | 0.054 |
| 11 | S-2 | 0.0225 | 8 | 99.9 | 504 | 0.051 |
| 12 | S-2 | 0.0180 | 8 | 99.9 | 505 | 0.048 |
| F | C-2 | 0.0225 | 11 | 99.7 | 504 | 0.049 |
| 13 | S-3 | 0.0360 | 9 | 99.8 | 497 | 0.050 |
| 14 | S-3 | 0.0180 | 15 | 99.9 | 506 | 0.051 |
| G | C-3 | 0.0360 | 30 | 98.9 | 500 | 0.047 |
| 15 | S-4 | 0.0360 | 30 | 98.8 | 501 | 0.039 |

[a]Reflection efficiency
[b]wavelength of maximum reflection
[c]Refractive index modulation.

Example 16

This example demonstrates the use of a sensitizer of this invention in combination with a red-light absorbing sensitizer to produce a composition that has full color, panchromatic response.

A coating solution was prepared consisting of: 19.49 g TFE/VAc (21/79 wt %, inherent viscosity 1.53 dL/g in THF); 6.90 g Photomer® 4.039; 1.50 g NVC; 0.900 g Sartomer 349; 0.300 g MMT; 0.030 g Sensitizer S-2; 0.030 g Sensitizer S-3; 0.015 g Sensitizer SQ-1; 0.84 g 2,3,5-TC1 HABI; 153.0 g dichloromethane, 8.5 g methanol, and 8.5 g 2-butanone. The solution was coated with a 150 micron doctor knife, dried, and imaged to record a series of reflection holograms at 514 and 647 nm. The holograms were exposed to ultraviolet and visible light, heated at 120° C. for 2 hr, and analyzed for reflection efficiency as described above. Dry coating thickness was between 12 and 16 microns. Results are given in Table 3.

TABLE 3

| Imaging Wavelength (nm) | Photospeed (mJ/cm$^2$) | RE[a] (%) | Wavelength[b] (nm) |
|---|---|---|---|
| 514 | 5 | 99.9 | 502 |
| 647 | 30 | 98.0 | 633 |

[a]Reflection efficiency
[b]Wavelength of maximum reflection

Examples 17–24

These examples demonstrates use of a sensitizer of this invention with various hexaarylbisimidazole photoinitiators.

Coating solutions were prepared consisting of: 7.90 g TFE/VAc (23/77 wt %, inherent viscosity 1.52 dL/g in THF); 2.70 g Photomer® 4039; 0.60 g NVC; 0.360 g Sartomer 349; 0.120 g MMT; 0.0156 g Sensitizer S-3; hexaarylbisimidazole as indicated in Table 4; 76.5 g dichloromethane, 4.25 g methanol, and 4.25 g 2-butanone. The solutions were coated with a 150 micron doctor knife, dried, and imaged to record a series of reflection holograms. The holograms were exposed to ultraviolet and visible light, heated at 120° C. for 2 hr, and analyzed as described in the General Procedures. Dry coating thickness ranged between 12 and 16 microns. Results are given in Table 4.

TABLE 4

| Exp. | HABI | Amt. (g) | RE[a] (%) | Wavelength[b] (nm) |
|---|---|---|---|---|
| 17 | o-Cl HABI | 0.300 | 99.8 | 504 |
| 18 | o-F HABI | 0.286 | 99.9 | 504 |
| 19 | o-TFM HABI | 0.330 | 99.7 | 504 |
| 20 | o-NO$_2$ HABI | 0.310 | 99.9 | 504 |
| 21 | 2,3-di-Cl HABI | 0.331 | 99.9 | 502 |
| 22 | 2,4-di-CL HABI | 0.331 | 99.8 | 503 |
| 23 | 2,4-di-F HABI | 0.300 | 99.9 | 505 |
| 24 | 2-Cl-5-NO$_2$ HABI | 0.341 | 99.8 | 503 |

[a]reflection efficiency
[b]Wavelength of maximum reflection

Examples 25–26

These examples illustrate photoinitiator systems comprising an (alpha-halo)methyl-1,3,5-triazine, a borate salt, and a sensitizer of this invention.

Coating solutions were prepared consisting of 9.9 1 g TFE/VAc (21/79 wt %, inherent viscosity 1.53 dL/g in THF); 3.60 g Photomer® 4039; 0.90 g NVC; 0.450 Sartomer 349; 0.375 g MMT; 0.0750 g 2,4,6-tris(trichloromethyl)-1,3,5-triazine; 0.0375 g tetrabutylammonium. triphenylbutylborate; sensitizer as indicated in Table 5; 76.5 g dichloromethane, 4.25 g methanol, and 4.25 g 2-butanone. Samples were prepared and evaluated as described in Examples 17–24. Dry coating thickness ranged between 7 and 9 microns. Results are given in Table 5.

TABLE 5

| Exp. | Sensitizer | Amt. (g) | Photospeed (mJ/cm²) | RE[a] (%) | Wavelength[b] (nm) |
|---|---|---|---|---|---|
| 25 | S-1 | 0.0270 | 4 | 63.8 | 503 |
| 26 | S-3 | 0.0270 | 5 | 70.8 | 503 |

[a]Reflection efficiency
[b]Wavelength of maximum reflection

Examples 27–30 and Control Examples H–J

These examples illustrate the storage stability in photopolymerizable compositions of sensitizers of this invention as well as that of comparison compounds.

Coating solutions were prepared containing 9.79 g TFE/VAc (21/79 wt %, inherent viscosity 1.5 dL/g in THF); 3.30 g Photomer® 4039; 0.90 g NVC; 0.45 g Sartomer 349; 0.15 g MMT; 0.375 g o-Cl HABI; sensitizer as indicated in Table 6; 76.50 g dichloromethane; 4.25 g methanol; and 4.25 g 2-butanone. Solutions were coated with a 50 micron doctor knife and dried as described in the General Procedures. Dry coating thickness ranged between 8 and 12 microns.

Absorption spectra were measured between 380 and 780 nm for each coating (1) immediately after preparation and (2) after five months storage in the dark at room temperature and humidity. Loss of sensitizing dye during storage was calculated from the decrease in absorbance (A) at each sensitizer's $l_{max}$:

Dye Loss (%)=(1- $A_{aged}/A_{fresh}$)×100

Results are reported in Table 6.

TABLE 6

| Example | Dye | Amt. (g) | Loss (%) |
|---|---|---|---|
| 27 | S-1 | 0.0270 | 7 |
| H | C-1 | 0.0225 | 42 |
| 28 | S-2 | 0.0270 | 30 |
| I | C-2 | 0.0210 | 100 |
| 29 | S-3 | 0.0270 | 0 |
| J | C-3 | 0.0360 | 40 |
| 30 | S-4 | 0.0360 | 22 |

What is claimed is:
1. A compound of structure:

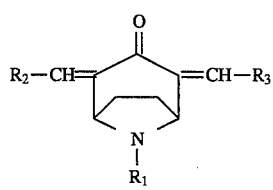

wherein:

$R_1$ is (1) hydrogen, (2) substituted or unsubstituted alkyl of 1 to 8 carbon atoms, (3) $CH_2=CHCO-$, (4) $CH_2=C(CH_3)CO-$ (5) $R_{15}CO-$, where $R_{15}$ is a substituted or unsubstituted aryl of 5 to 10 atoms or a substituted or unsubstituted alkyl containing 1 to 8 carbon atoms; and $R_2$ and $R_3$, alike or different, are:

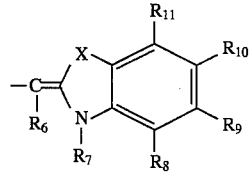

wherein:

X is O, S, Se, $NR_{12}$, or $CR_{13}R_{14}$, where $R_{12}$, $R_{13}$, and $R_{14}$ are each independently alkyl of 1 to 6 carbon atoms or substituted or unsubstituted phenyl;

$R_6$ is hydrogen or substituted or unsubstituted alkyl of 1 to 4 carbon atoms;

$R_7$ is (1) substituted or unsubstituted alkyl or cycloalkyl of 1 to 8 carbon atoms or (2) substituted or unsubstituted aryl of 5 to 10 atoms;

$R_8$, $R_9$, $R_{10}$, and $R_{11}$ each are independently hydrogen, halogen, dialkylamino, substituted or unsubstituted alkyl or cycloalkyl of 1 to 6 carbon atoms, substituted or unsubstituted alkoxyl of 1 to 6 carbon atoms, substituted or unsubstituted thioalkoxyl of 1 to 6 carbon atoms, or substituted phenyl; or ($R_8$ and $R_9$), ($R_9$ and $R_{10}$), or ($R_{10}$ and $R_{11}$) are joined in a substituted or unsubstituted aromatic ring of 5 to 10 atoms.

2. The compound of claim 1 wherein $R_2$ and $R_3$ are the same.

3. The compound of claim 2 wherein X is $C(CH_3)_2$; $R_6$, $R_8$, $R_9$, $R_{10}$, and $R_{11}$ are the same and equal to hydrogen; and $R_7$ is alkyl of 1 to 4 carbon atoms.

4. The compound of claim 3 wherein X is O; $R_6$, $R_8$, $R_9$, $R_{10}$, and $R_{11}$ are the same and equal to hydrogen; and $R_7$ is alkyl of 1 to 4 carbon atoms.

5. The compound of claim 3 wherein X is S; $R_6$, $R_8$, $R_9$, $R_{10}$, and $R_{11}$ are the same and equal to hydrogen and $R_7$ is alkyl of 1 to 4 carbon atoms.

6. The compound of claim 5 wherein X is S; $R_6$, $R_{10}$, and $R_{11}$ are the same and equal: to hydrogen; $R_7$ is alkyl of 1 to 4 carbon atoms; and $R_8$ and $R_9$ are joined to form a six membered aromatic ring.

* * * * *